US010826025B2

(12) United States Patent
Kim et al.

(10) Patent No.: US 10,826,025 B2
(45) Date of Patent: Nov. 3, 2020

(54) FLEXIBLE DISPLAY DEVICE

(71) Applicant: LG Display Co., Ltd., Seoul (KR)

(72) Inventors: Keun-Young Kim, Paju-si (KR); Young-Sub Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/710,869

(22) Filed: Dec. 11, 2019

(65) Prior Publication Data

US 2020/0212364 A1 Jul. 2, 2020

(30) Foreign Application Priority Data

Dec. 28, 2018 (KR) ........................ 10-2018-0172128

(51) Int. Cl.
| | |
|---|---|
| *B32B 7/12* | (2006.01) |
| *H01L 51/00* | (2006.01) |
| *H01L 27/32* | (2006.01) |
| *H01L 51/52* | (2006.01) |
| *G02B 3/00* | (2006.01) |
| *G06F 3/041* | (2006.01) |

(52) U.S. Cl.
CPC ............ *H01L 51/5275* (2013.01); *B32B 7/12* (2013.01); *G02B 3/0062* (2013.01); *G06F 3/0412* (2013.01); *H01L 27/323* (2013.01); *H01L 27/3244* (2013.01); *H01L 51/0097* (2013.01); *H01L 51/524* (2013.01); *H01L 51/529* (2013.01); *H01L 51/5281* (2013.01); *B32B 2457/208* (2013.01); *G06F 2203/04102* (2013.01); *H01L 2251/5338* (2013.01)

(58) Field of Classification Search
CPC ... H01L 51/5246; G06F 3/0412; G06F 1/1652
See application file for complete search history.

(56) References Cited

U.S. PATENT DOCUMENTS

| | | | | |
|---|---|---|---|---|
| 6,280,847 | B1 * | 8/2001 | Corkhill ............ | B32B 17/10036 296/146.1 |
| 2002/0176038 | A1 * | 11/2002 | Watanabe ......... | G02F 1/133526 349/112 |
| 2003/0214623 | A1 * | 11/2003 | Ebisu .................. | G02F 1/13394 349/156 |
| 2004/0076396 | A1 | 4/2004 | Suga | |
| 2010/0177259 | A1 * | 7/2010 | Ichioka ............. | G02F 1/133308 349/58 |
| 2012/0305181 | A1 * | 12/2012 | Nam .................... | B32B 27/304 156/305 |
| 2015/0144913 | A1 * | 5/2015 | Shim ......................... | C09J 7/10 257/40 |

(Continued)

FOREIGN PATENT DOCUMENTS

| | | |
|---|---|---|
| KR | 10-2003-0078889 A | 10/2003 |
| KR | 10-2017-0097562 A | 8/2017 |
| KR | 10-2018-0086558 A | 8/2018 |

*Primary Examiner* — Sepehr Azari
(74) *Attorney, Agent, or Firm* — Fenwick & West LLP

(57) ABSTRACT

A flexible display device includes: a display panel; a back cover on a rear surface of the display panel; and an optical adhesive layer between the display panel and the back cover, the optical adhesive layer including first and second hard layers and a soft layer between the first and second hard layers, at least one of the first and second hard layers having a first modulus and the soft layer having a second modulus less than the first modulus.

15 Claims, 10 Drawing Sheets

(56) References Cited

U.S. PATENT DOCUMENTS

2016/0111678 A1* 4/2016 Lee ............................ C09J 9/00
                                                          257/40
2017/0153668 A1* 6/2017 Jang ...................... G06F 1/1641
2018/0132370 A1* 5/2018 Choi ................... H01L 51/0097

* cited by examiner

FLEXIBLE DISPLAY DEVICE

CROSS-REFERENCE TO RELATED APPLICATIONS

The present application claims the priority benefit of the Republic of Korea Patent Application No. 10-2018-0172128 filed in the Republic of Korea on Dec. 28, 2018, the disclosure of which is hereby incorporated by reference in its entirety for all purposes as if fully set forth herein.

BACKGROUND

Field of Technology

The present disclosure relates to a flexible display device, and more particularly, to a flexible display device where an impact resistance is improved.

Discussion of the Related Art

Recently, as the advent of full-fledged information age, a display field has rapidly developed for processing and displaying mass information. In response to such changes, various flat panel display (FPD) devices have been developed and brought into the spotlight.

Specific examples of the flat panel display device include liquid crystal display (LCD) devices, plasma display panel (PDP) devices, field emission display (FED) devices, electroluminescent display (ELD) devices, organic light emitting diode (OLED) devices, and the like. The FPD devices exhibit high performance in terms of a thin profile, a light weight and a low power consumption, and are rapidly replacing the existing cathode ray tube (CRT) devices.

Since the FPD devices use a glass substrate to stand a heat generated during a fabrication process, there exists a limit for a light weight, a thin profile and a flexibility.

Accordingly, a flexible display device which maintains a display function using a flexible material such as a plastic instead of a glass without a flexibility even when the flexible display device is bent like a paper has been the subject of a next generation FPD device.

The flexible display device has advantages in a space utilization, an interior and a design.

The flexible display device may be classified into a bendable display device, a rollable display device and a foldable display device. In addition, a stretchable display device which is stretched along a random direction has been suggested as a flexible display device.

However, the flexible display device using a flexible substrate has a disadvantage such that an impact resistance alleviating or absorbing an impact applied from an exterior is relatively low.

SUMMARY

Accordingly, the present disclosure is directed to a flexible display device that substantially obviates one or more of the problems due to limitations and disadvantages of the related art.

An object of the present disclosure is to provide a flexible display device where an impact resistance is improved.

Additional features and advantages of the disclosure will be set forth in the description which follows, and in part will be apparent from the description, or may be learned by practice of the aspects described in the disclosure. These and other advantages will be realized and attained by the structure particularly pointed out in the written description and claims hereof as well as the appended drawings.

To achieve these and other advantages, as embodied and broadly described herein, a flexible display device includes: a display panel; a back cover on a rear surface of the display panel; and an optical adhesive layer between the display panel and the back cover, the optical adhesive layer including first and second hard layers and a soft layer between the first and second hard layers, at least one of the first and second hard layers having a first modulus and the soft layer having a second modulus smaller than the first modulus.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to the present disclosure, examples of which are illustrated in the accompanying drawings.

Figure 1A:
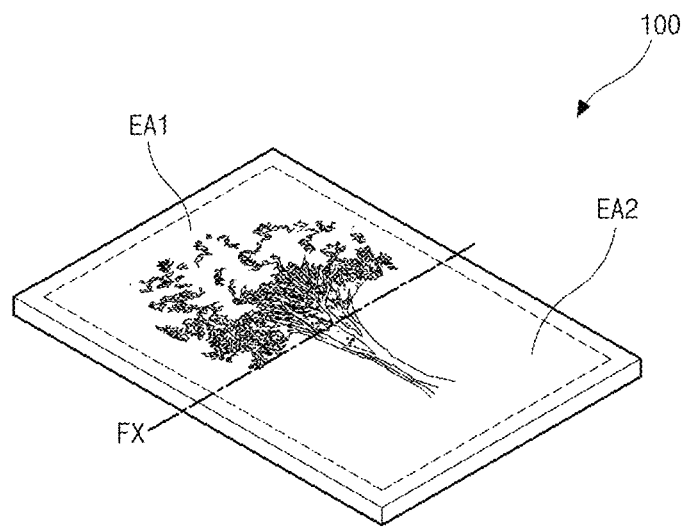
FIGS. 1A, 1B and 1C are perspective views showing a folding state and an unfolding state of a flexible display device, according to a first embodiment of the present disclosure.
Figure 1B:
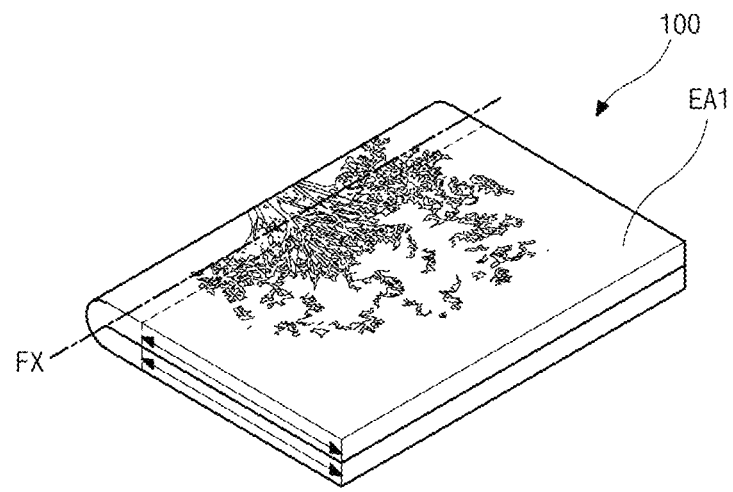
Figure 1C:
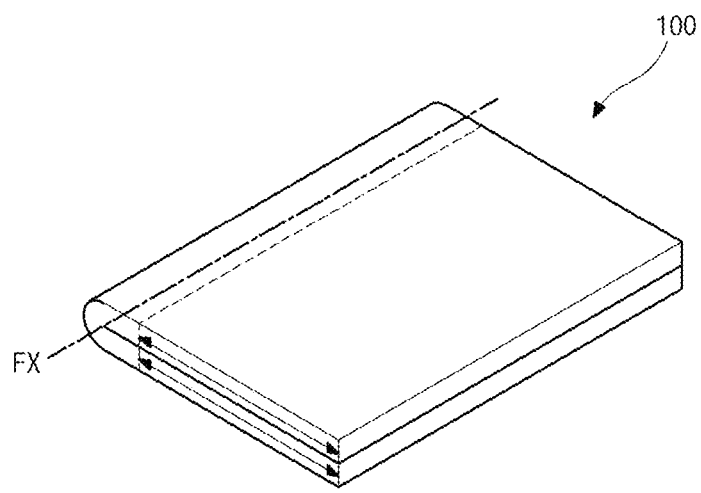

FIGS. 1A, 1B and 1C are perspective views showing a folding state and an unfolding state of a flexible display device according to a first embodiment of the present disclosure. All the components of the organic light emitting diode display devices according to all embodiments of the present disclosure are operatively coupled and configured.

In FIGS. 1A, 1B and 1C, a foldable display device is shown as an example of a flexible display device 100. The present disclosure is not limited thereto, and present disclosure may be applied to various flexible display device such as a curved display device, a bendable display device, a rollable display device and a stretchable display device.

The flexible display device 100 according to a first embodiment of the present disclosure may be applied to a small and medium size device such as a portable phone, a personal computer, a notebook computer, a personal digital terminal, a car navigation unit, a game machine, a portable electronic device, a watch type electronic device and a camera as well as a large size device such as a television and an outdoor billboard.

In FIG. 1A, a flexible display device 100 includes a plurality of areas on a display surface. The flexible display device 100 may include first and second display areas EA1 and EA2 each displaying an image with respect to a folding axis FX.

In FIG. 1B, the second display area EA2 rotates clockwise with respect to the folding axis FX such that the flexible display device 100 has an outer folding state where the first and second display areas EA1 and EA2 are disposed as an outer surface.

In FIG. 1C, the second display area EA2 rotates counterclockwise with respect to the folding axis FX such that the flexible display device 100 has an inner folding state where the first and second display areas EA1 and EA2 are disposed as an inner surface.

In the flexible display device 100 according to a first embodiment of the present disclosure, an outer extreme folding and an inner extreme folding are obtained and an impact resistance is improved.

Accordingly, since deterioration of a thin film transistor (TFT) DTr (of FIG. 2C) and a light emitting diode E (of FIG. 2C) is prevented even when an external impact is applied, reduction in reliability of the flexible display device 100 is prevented.

Figure 2A:
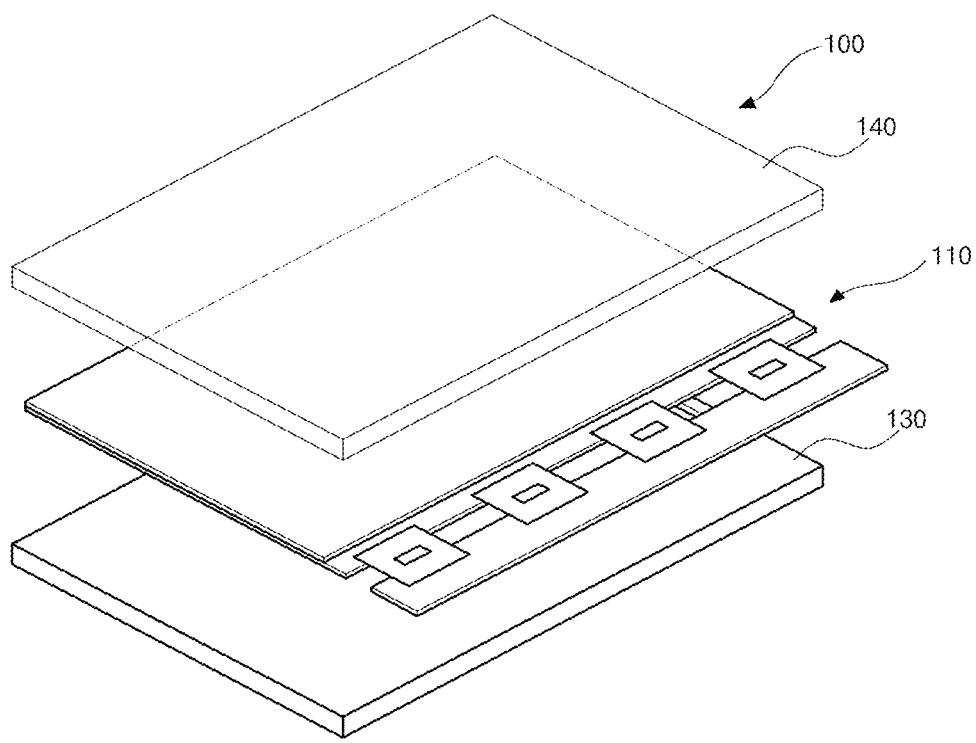
FIG. 2A is an exploded perspective view showing a flexible display device, according to a first embodiment of the present disclosure.
Figure 2B:
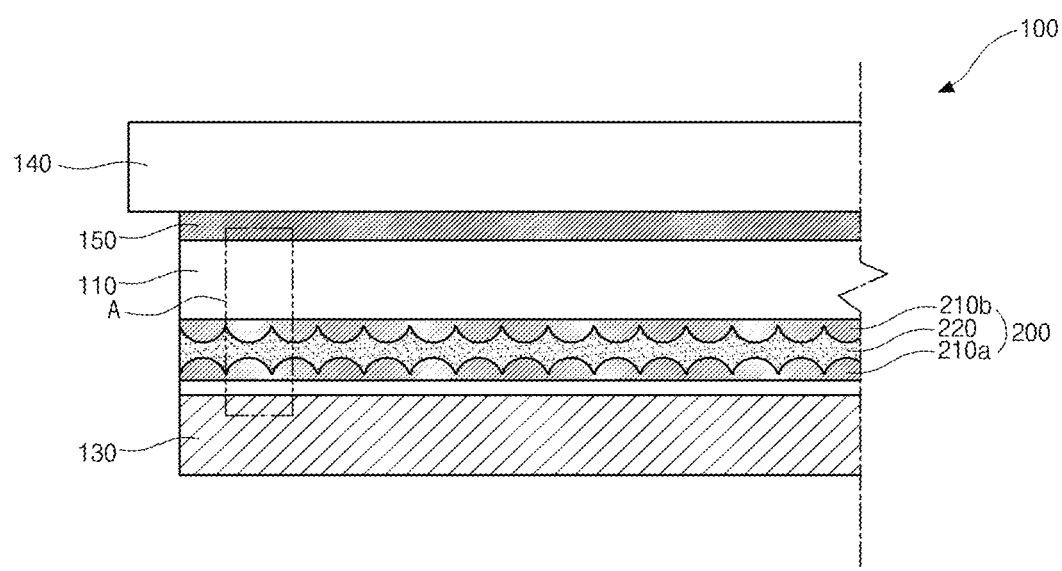
FIG. 2B is a cross-sectional view showing a flexible display device, according to a first embodiment of the present disclosure.
Figure 2C:
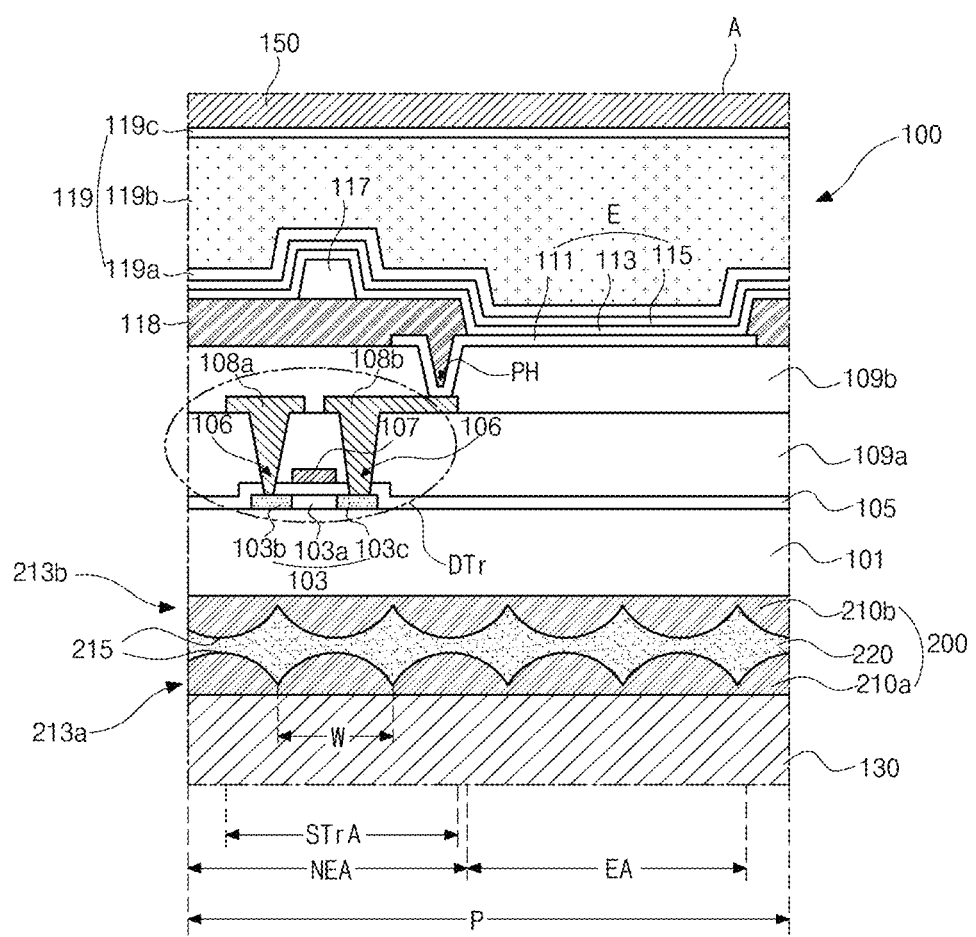
FIG. 2C is a magnified view of a portion A of FIG. 2B, according to a first embodiment.

FIG. 2A is an exploded perspective view showing a flexible display device according to a first embodiment of the present disclosure, FIG. 2B is a cross-sectional view showing a flexible display device according to a first embodiment of the present disclosure, and FIG. 2C is a magnified view of a portion A of FIG. 2B.

Figure 3:
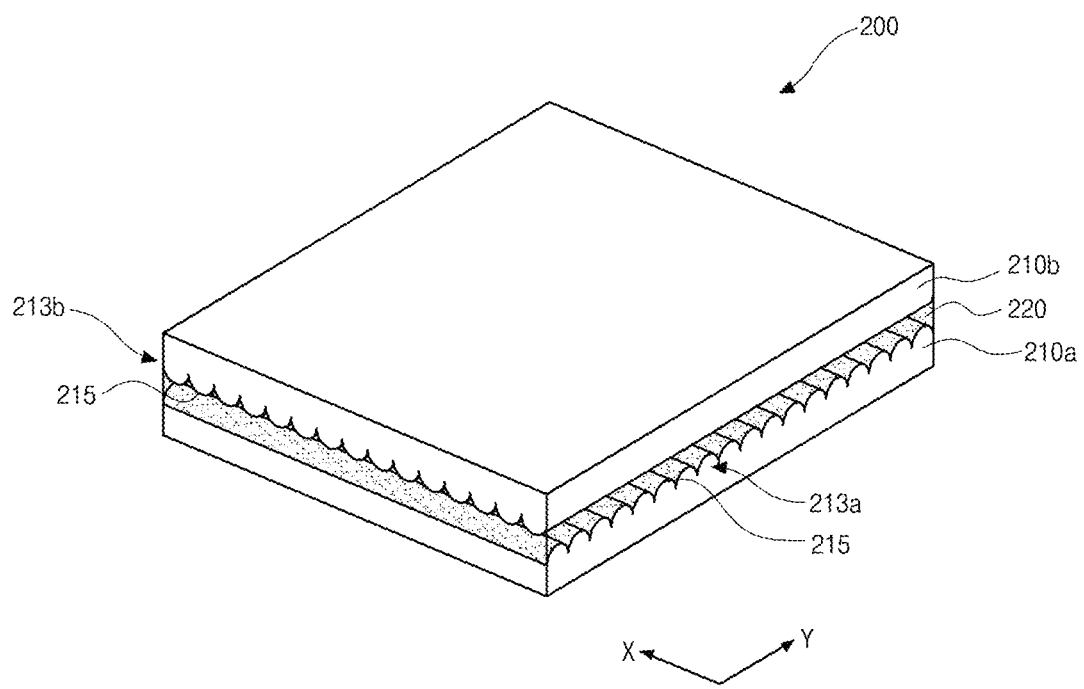
FIG. 3 is a perspective view showing an optical adhesive layer of a flexible display device, according to a first embodiment of the present disclosure.

FIG. 3 is a perspective view showing an optical adhesive layer of a flexible display device according to a first embodiment of the present disclosure.

Figure 4A:
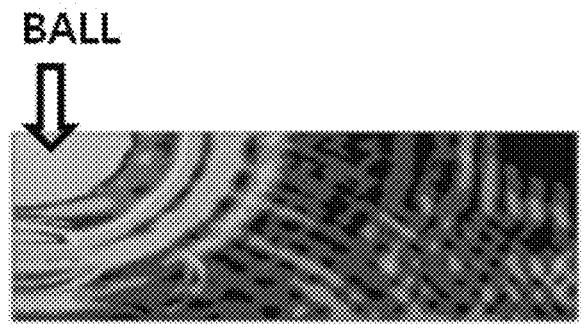
FIG. 4A is a simulation result showing an impact resistance of a flexible display device including an optical adhesive layer without first and second lens layers, according to a comparison example.
Figure 4B:
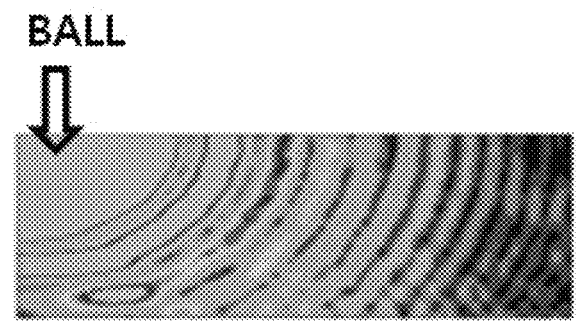
FIG. 4B is a simulation result showing an impact resistance of a flexible display device including an optical adhesive layer with first and second lens layers, according to a first embodiment of the present disclosure.

FIG. 4A is a simulation result showing an impact resistance of a flexible display device including an optical adhesive layer without first and second lens layers according to a comparison example, and FIG. 4B is a simulation result showing an impact resistance of a flexible display device including an optical adhesive layer with first and second lens layers according to a first embodiment of the present disclosure.

Figure 5:
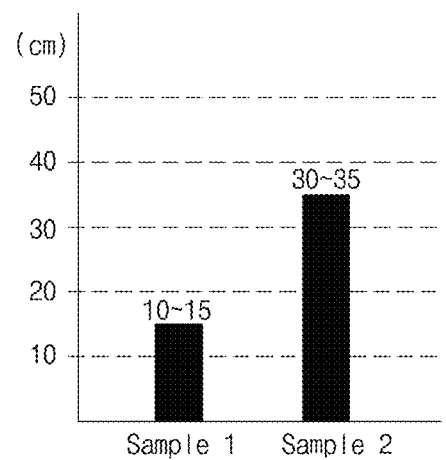
FIG. 5 is a graph showing a result of a ball drop test of a flexible display device, according to a first embodiment of the present disclosure.

FIG. 5 is a graph showing a result of a ball drop test of a flexible display device according to a first embodiment of the present disclosure.

In FIGS. 2A to 2C, a flexible display device 100 according to a first embodiment of the present disclosure includes a display panel 110 for displaying an image, a back cover 130 for supporting the display panel 110 and a cover window 140 for protecting the display panel 110.

When an image is displayed by an upper surface of the display panel 110, the cover window 140 is disposed over the display panel 110 and the back cover 130 is disposed under the display panel 110.

The display panel 110 displaying an image may include one of a liquid crystal display (LCD) panel, a plasma display panel (PDP) panel, a field emission display (FED) panel, an electroluminescence display (ELD) panel and an organic light emitting diode (OLED) display panel. The flexible display device 100 including an OLED display panel as the display panel 110 will be exemplarily illustrated.

Since the OLED display panel as an emissive device does not require a backlight unit used in an LCD panel as a non-emissive device, the OLED display panel has a light weight and a thin profile. The OLED display panel has a wide viewing angle and a high contrast ratio as compared with the LCD panel. In addition, the OLED display panel has a low power consumption and a fast response speed. The OLED display panel may be driven with a low direct current voltage. Since the OLED display panel includes inner elements of a solid state, the OLED display panel has a strong resistance to an external impact and a wide available temperature range.

Specifically, since a fabrication process is simple, a fabrication cost of the OLED display panel may be reduced as compared with the LCD panel.

In the OLED display panel, a substrate where a driving thin film transistor and a light emitting diode are formed is encapsulated by a protecting film.

The OLED display panel as a display panel 110 according to a first embodiment of the present disclosure may be classified into a top emission type and a bottom emission type according to an emission direction of a light. The top emission type OLED display panel will be exemplarily illustrated hereinafter.

Each pixel region P includes an emission area EA where a light emitting diode E is formed to display an image and a non-emission area NEA surrounding the emission area EA and including a switching area STrA where a driving thin film transistor (TFT) DTr is formed.

A semiconductor layer 103 is disposed in the switching area STrA of the non-emission area NEA of each pixel region P on a substrate 101 of the display panel 110 of an OLED display panel. The semiconductor layer 103 includes an active region 103a constituting a channel at a central portion thereof and source and drain regions 103b and 103c at both sides of the active region 103a. The active region 103a may include intrinsic silicon and the source and drain regions 103b and 103c may include impurity doped silicon.

A gate insulating layer 105 is disposed on the semiconductor layer 103, and a gate electrode 107 is disposed on the gate insulating layer 105 over the active region 103a of the semiconductor layer 103. A gate line (not shown) is disposed along a direction on the gate insulating layer 105.

An interlayer insulating layer 109a is disposed on the gate electrode 107 and the gate line. The interlayer insulating layer 109a and the gate insulating layer 105 have first and second semiconductor contact holes 106 exposing the source and drain regions 103b and 103c at both sides of the active region 103a.

Source and drain electrodes 108a and 108b spaced apart from each other are disposed on the interlayer insulating layer 109a. The source and drain electrodes 108a and 108b are connected to the source and drain regions 103b and 103c, respectively, through the first and second semiconductor contact holes 106.

A protecting layer 109b is disposed on the source and drain electrodes 108a and 108b and on the interlayer insulating layer 109a exposed between the source and drain electrodes 108a and 108b.

The source and drain electrodes 108a and 108b, the semiconductor layer 103 including the source and drain regions 103b and 103c contacting the source and drain electrodes 108a and 108b, the gate insulating layer 105 on the semiconductor layer 103 and the gate electrode 107 constitute the driving TFT DTr.

In some embodiments, a data line (not shown) crossing the gate line to define the pixel region P is disposed on the interlayer insulating layer 109a. A switching TFT (not shown) having the same structure as the driving TFT DTr is connected to the driving TFT DTr.

The switching TFT and the driving TFT DTr may be classified into an amorphous silicon thin film transistor (a-Si TFT), a polycrystalline silicon thin film transistor (p-Si TFT), a single crystalline silicon thin film transistor (c-Si TFT) and an oxide thin film transistor (oxide TFT) according to a kind of the semiconductor layer 103. Although the semiconductor layer 103 has a top gate type in FIG. 2C, the semiconductor layer 103 may have a bottom gate type of intrinsic amorphous silicon and impurity-doped amorphous silicon in another embodiment.

The protecting layer 109b has a drain contact hole PH exposing the drain electrode 108b, and a first electrode 111 connected to the drain electrode 108b through the drain contact hole PH is disposed on the protecting layer 109b. The first electrode 111 may include a material having a relatively high work function to constitute an anode of a light emitting diode E.

The first electrode 111 may include a metallic material having a relatively high reflectance. The first electrode 111 may have a laminated structure (Ti/Al/Ti) of aluminum (Al) and titanium (Ti), a laminated structure (ITO/Al/ITO) of aluminum (Al) and indium tin oxide (ITO), an APC alloy of silver (Ag), palladium (Pd) and copper (Cu) and a laminated structure (ITO/APC/ITO) of APC alloy and indium tin oxide (ITO).

The first electrode 111 is disposed in each pixel region P, and a bank 118 is disposed between the first electrodes 111 of the adjacent pixel regions P. The first electrode 111 is divided into each pixel region P with the bank 118 as a boundary of the pixel region P.

A spacer 117 may be disposed on the bank 118 to protect a light emitting layer 113 of a light emitting diode E from an external pressure.

The light emitting layer 113 is disposed on the first electrode 111. The light emitting layer 113 may have a single layer of an emitting material. The light emitting layer 113 may have a multiple layer of a hole injecting layer (HIL), a hole transporting layer (HTL), an emitting material layer (EML), an electron transporting layer (ETL) and an electron injecting layer (EIL).

A second electrode 115 is disposed on a whole of the light emitting layer 113 on the substrate 101 to constitute a cathode.

The light emitting layer 113 may be commonly disposed on the pixel regions P as a common layer of a white emitting layer emitting a white light. Alternatively, the light emitting layer 113 may be divided in each pixel region P to include different materials.

When the light emitting layer 113 is divided in each pixel region P, the light emitting layer 113 may have different thicknesses in the pixel regions P.

The second electrode 115 may include a material having a relatively low work function.

For example, the second electrode 115 may include a transparent conductive material such as indium tin oxide (ITO) and indium zinc oxide (IZO) or a semi-transmissive conductive material such as magnesium (Mg), silver (Ag) and an alloy of magnesium (Mg) and silver (Ag).

When the second electrode 115 is formed of a semi-transmissive conductive material, a light extraction efficiency may be improved by a micro cavity.

A capping layer may be disposed on the second electrode 115.

When a voltage is applied to the first and second electrodes 111 and 115 of the light emitting diode E according to a selected signal, a hole injected from the first electrode 111 and an electron injected from the second electrode 115 are transmitted to the light emitting layer 113 to constitute an exciton. When the exciton transitions from an excited state to a ground state, a light may be emitted from the light emitting layer 113 as a visible ray.

The light of the light emitting layer 113 may pass through the transparent second electrode 115 to be emitted toward an exterior such that an image is displayed.

After a protecting film 119 of a thin film type is disposed on the driving TFT DTr and the light emitting diode E, the display panel 110 is encapsulated by attaching the protecting film 119 and the substrate 101.

To prevent penetration of an external oxygen and an external moisture into an interior of the display panel 110, the protecting film 119 may include at least two inorganic protecting films 119a and 119c. An organic protecting film 119b for supplementing impact resistance of the at least two inorganic protecting films 119a and 119c may be interposed between the at least two inorganic protecting films 119a and 119c.

As a result, penetration of the moisture and the oxygen from the exterior to the interior of the display panel 110 may be prevented.

A polarizing plate 150 for preventing reduction of a contrast ratio due to an external light may be disposed on an outer surface of the protecting film 119 of the display panel 110 of the OLED display panel. Since the polarizing plate 150 blocking the external light is disposed on a front surface of the OLED display panel in a driving mode where a light from the light emitting layer 113 is emitted, the contrast ratio increases.

The cover window 140 for protecting the display panel 110 is disposed on the polarizing plate 150.

The cover window 140 protects the display panel 110 from an external impact and transmits the light emitted from the display panel 110 such that an image displayed by the display panel 110 is shown to the exterior.

The cover window 140 includes a material having a relatively high impact resistance and a relatively high transmittance. For example, the cover window 140 may include one of polymethylmethacrylate (PMMA), polycarbonate (PC), cycloolefin polymer (COP), polyethylene terephthalate (PET), polyimide (PI) and polyaramid (PA).

The back cover 130 is disposed on a rear surface of the display panel 110 having the polarizing plate 150 and the cover window 140, i.e., an outer surface of the substrate 101 such that the display panel 110 is supported by the back cover 130.

The back cover 130 has a plate shape. Although not shown, a hemming portion may be further formed along a boundary of the back cover 130 to increase a rigidity of the back cover 130.

The back cover 130 may include one of copper (Cu), silver (Ag), aluminum (Al), iron (Fe), nickel (Ni), tungsten (W) and an alloy including at least one of copper (Cu), silver (Ag), aluminum (Al), iron (Fe), nickel (Ni) and tungsten (W). Alternatively, the back cover 130 may be plated with at least one of nickel (Ni), silver (Ag), gold (Au) and an alloy including at least one of nickel (Ni), silver (Ag) and gold (Au).

When the back cover 130 is formed of aluminum (Al) having a relatively high heat conductivity, the back cover 130 may include aluminum (Al) of a purity of about 99.5%. In addition, an oxide film of a black color may be formed on a surface of the back cover through an anodizing treatment. Since the back cover 130 through an anodizing treatment has a black color, a heat absorptivity increases and a heat conductivity of the back cover 130 is improved.

As a result, the back cover 130 may effectively radiate a heat of a relatively high temperature generated from the display panel 110 to an exterior.

The back cover 130 and the display panel 110 are attached and fixed to each other through an optical adhesive layer 200. In the flexible display device 100 according to a first embodiment of the present disclosure, the optical adhesive layer 200 may include a soft layer 220 and first and second hard layers 210a and 210b.

Due to the optical adhesive layer 200, the flexible display device 100 may be extremely folded along inside and outside and an impact resistance of the flexible display device 100 may be improved. Since deterioration of the driving TFT DTr and the light emitting diode E is prevented even when an external impact is applied, reduction in reliability of the flexible display device 100 is prevented.

In FIG. 3, the optical adhesive layer 200 may include an optically cleared adhesive (OCA). The optical adhesive layer 200 may have a thickness of about 100 μm (micrometers) to about 300 μm. When the optical adhesive layer 200 has a thickness smaller than about 100 μm, it is difficult to modularize the display panel 110 and the back cover 130 due to a weak adhesive force. When the optical adhesive layer 200 has a thickness greater than about 300 μm, it is difficult to fold the flexible display device 100.

The optical adhesive layer 200 may include the first and second hard layers 210a and 210b each having a first modulus and the soft layer 220 having a second modulus smaller than the first modulus. The soft layer 220 may be disposed between the first and second hard layers 210a and 210b.

The first and second hard layers 210a and 210b having the first modulus may disperse the impact applied to the flexible display device 100. The first modulus may be within a range of about 50 mPa to about 100 mPa.

The soft layer 220 having the second modulus may buffer the dispersed impact by the first and second hard layers 210a and 210b. The second modulus may be within a range of about 1 mPa to about 10 mPa.

Since the optical adhesive layer 200 includes a mixed structure of the layer of relatively low modulus and a layer of a relatively high modulus, an impact resistance of the optical adhesive layer 200 itself is improved. As a result, an impact resistance of the flexible display device 100 is improved.

In the flexible display device 100, the thin films may not absorb (horizontally transmit) the impact and may vertically transmit the impact. When the impact from an exterior is applied to the flexible display device 100, the flexible display device 100 may have a deformation such as a bending and may have a relatively small impact absorption amount.

As a result, when an impact is applied to the flexible display device 100, the impact may be transmitted to an interior of the display panel 110 such that elements such as the driving TFT DTr and the light emitting diode E of the display panel 110 may be deteriorated.

When an adhesive having a relatively low rigidity and a relatively low hardness is used for attaching the display panel 110 and the back cover 130, the impact from the exterior is transmitted to the elements such as the driving TFT DTr and the light emitting diode E in the display panel 110.

In the flexible display device 100 according to a first embodiment of the present disclosure, since the optical adhesive layer 200 having a mixed structure of a layer having a relatively low modulus and a layer having a relatively high modulus is used for attaching the display panel 110 and the back cover 130, the impact applied from the exterior to the flexible display device 100 may be mitigated while passing through the layers having low and high moduli of the optical adhesive layer 200.

Specifically, the first and second hard layers 210a and 210b disperse the impact applied from the exterior, and the soft layer 220 buffering the impact by absorption is disposed between the first and second hard layers 210a and 210b. As a result, transmission of the impact to the display panel 110 may be effectively reduced.

Accordingly, the impact resistance of the flexible display device 100 is improved.

In the optical adhesive layer 200 according to a first embodiment of the present disclosure, each of the first and second hard layers 210a and 210b may have a plurality of lenticular lenses 215 having a convex portion and a concave portion. Each of the plurality of lenticular lenses 215 has a half cylindrical shape protruding from the first and second hard layers 210a and 210b. Axes of the plurality of lenticular lenses 215 of the first and second hard layers 210a and 210b may cross each other.

For example, the plurality of lenticular lenses 215 may protrude from the first hard layer 210a to the second hard layer 210b to constitute a first lens layer 213a, and the plurality of lenticular lenses 215 may protrude from the second hard layer 210b to the first hard layer 210a to constitute a second lens layer 213b.

When the lenticular lens 215 of the first and second lens layers 213a and 213b of the first and second hard layers 210a and 210b returns from a deformed shape due to an external impact to an original shape, the lenticular lens 215 compensates a volume. As a result, an elastic force of the first and second hard layers 210a and 210b increases, and the first and second hard layers 210a and 210b may effectively disperse the impact applied to the flexible display device 100.

Although the axes of the lenticular lenses 215 of the first and second lens layers 213a and 213b are disposed along the same direction in FIGS. 2B and 2C for illustration, the axes of the lenticular lenses 215 of the first and second lens layers 213a and 213b are disposed to cross each other as shown in FIG. 3.

For example, the axis of the lenticular lenses 215 of the first lens layer 213a may be disposed along an X axis direction and the axis of the lenticular lenses 215 of the second lens layer 213b may be disposed along a Y axis direction. As a result, the axes of the lenticular lenses 215 of the first and second lens layers 213a and 213b may be disposed perpendicular to each other.

Since the first and second hard layers 210a and 210b disperse the impact applied from the exterior along the X and Y axis directions, the first and second hard layers 210a and 210b may effectively disperse the impact applied to the flexible display device 100.

Accordingly, the impact resistance of the flexible display device 100 is further improved.

The effects by the structure of the first and second lens layers 213a and 213b will be illustrated with reference to FIGS. 4A and 4B.

In FIGS. 4A and 4B, when a ball is dropped on a point of the flexible display device 100, a transmission shape of an impact of the ball along a horizontal direction at a front surface of the flexible display device 100 is simulated.

In FIG. 4A, a flexible display device according to a comparison example includes an optical adhesive layer including first and second hard layers and a soft layer between the first and second hard layers without first and second lens layers.

In FIG. 4B, a flexible display device 100 according to a first embodiment of the present disclosure includes an optical adhesive layer 200 including first and second hard layers 210a and 210b and a soft layer 220 between the first and second hard layers 210a and 210b with first and second lens layers 213a and 213b of the first and second hard layers 210a and 210b. The axes of the lenticular lenses 215 of the first and second lens layers 213a and 213b may be disposed perpendicular to each other.

In FIG. 4A, when the optical adhesive layer does not include the first and second lens layers, the impact applied by the ball is not transmitted along the horizontal direction and is concentrated on a drop point.

In FIG. 4B, when the optical adhesive layer 200 includes the first and second lens layers 213a and 213b having the lenticular lenses 215, the impact applied by the ball is transmitted along the horizontal direction toward the whole surface.

Since the first and second hard layers 210a and 210b of the optical adhesive layer 200 according to a first embodiment of the present disclosure include the first and second lens layers 213a and 213b having the plurality of lenticular lenses 215 whose axes are disposed to cross each other, the first and second hard layers 210a and 210b may effectively disperse the impact applied to the flexible display device 100.

Since the impact is effectively dispersed by the first and second hard layers 210a and 210b, the optical adhesive layer 200 may improve the impact resistance of the flexible display device 100.

In FIG. 5, the vertical axis represents a height where the ball is dropped. The Sample 1 of the horizontal axis represents a flexible display device including an optical adhesive layer without first and second lens layers according to a comparison example, and the Sample 2 represents a flexible display device 100 including an optical adhesive layer 200 with first and second lens layers 213a and 213b according to a first embodiment of the present disclosure.

The bar of FIG. 5 corresponds to the height of the ball where a breakdown of the flexible display device begins.

In FIG. 5, the breakdown of the display panel of the Sample 1 occurs when the ball is dropped at the height of about 10 cm to about 15 cm, and the breakdown of the display panel 110 of the Sample 2 occurs when the ball is dropped at the height of about 30 cm to about 35 cm.

In the flexible display device 100 according to a first embodiment of the present disclosure, the optical adhesive layer 200 includes the soft layer 220 having a relatively low modulus and the first and second hard layers 210a and 210b having a relatively high modulus, and the first and second hard layers 210a and 210b include the first and second lens layers 213a and 213b having the plurality of lenticular lenses 215. Specifically, the axes of the lenticular lenses 215 of the first and second lens layers 213a and 213b are disposed to cross each other. As a result, the impact from the exterior is further mitigated by the optical adhesive layer 200, and transmission of the impact to the display panel 110 is reduced.

Each lenticular lens 215 may have a width of about 50 μm to about 150 μm. When the lenticular lens 215 has a width smaller than about 50 μm, the lenticular lens 215 having a sufficient height may not be formed. When the lenticular lens 215 has a width greater than about 150 μm, an adhesive surface between the first hard layer 210a and the soft layer 220 and between the second hard layer 210b and the soft layer 220 is reduced, and the optical adhesive layer 200 including the first and second hard layers 210a and 210b and the soft layer 220 may not be formed.

Although the lenticular lens 215 of the first and second lens layers 213a and 213b has a cross-sectional shape of a half circle in a first embodiment, the lenticular lens may have different shape in another embodiment.

For example, the first and second lens layers 213a and 213b may have a cross-sectional shape of a prism or a cross-sectional shape of a lenticular lens and a prism.

In the flexible display device 100 according to a first embodiment of the present disclosure, since the optical adhesive layer 200 includes the soft layer 220 having a relatively low modulus and the first and second hard layers 210a and 210b having a relatively high modulus, the impact resistance of the flexible display device 100 is improved.

In addition, since the first and second hard layers 210a and 210b include the first and second lens layers 213a and 213b having the lenticular lenses 215 whose axes are disposed to cross each other, the first and second hard layers 210a and 210b effectively disperse the impact applied from the exterior and the impact resistance of the flexible display device 100 is further improved.

Figure 6A:
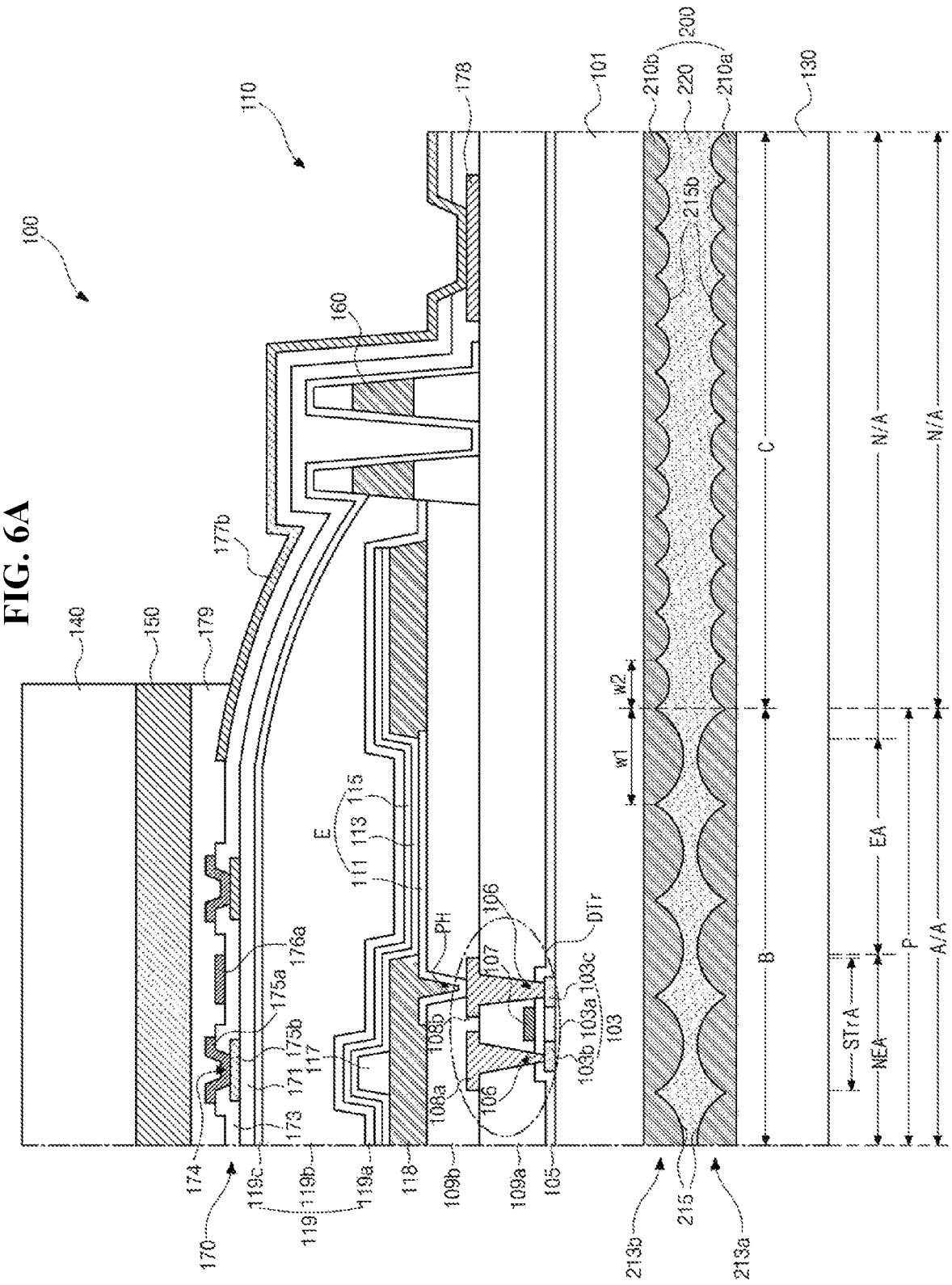
FIG. 6A is a cross-sectional view showing a flexible display device including a touch pattern, according to a second embodiment of the present disclosure.
Figure 6B:
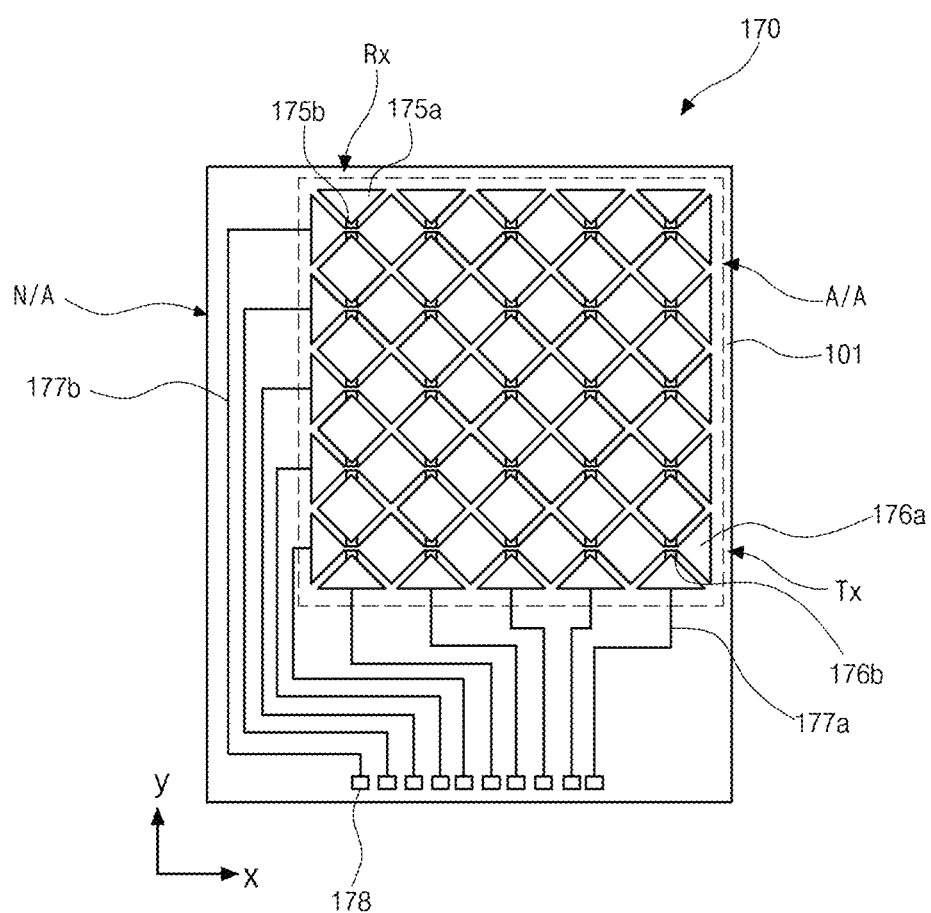
FIG. 6B is a plan view showing a touch pattern, according to a second embodiment of the present disclosure.

FIG. 6A is a cross-sectional view showing a flexible display device including a touch pattern according to a second embodiment of the present disclosure, and FIG. 6B is a plan view showing a touch pattern according to a second embodiment of the present disclosure.

Figure 7A:
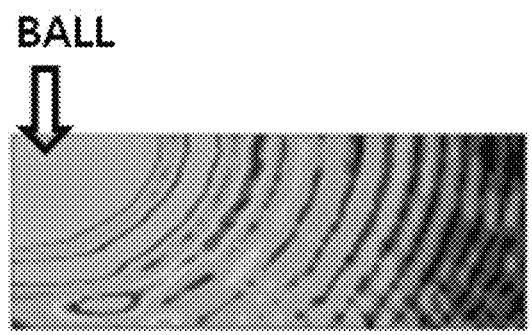
FIGS. 7A and 7B are simulation results showing an impact resistance of an active area and a non-active area, respectively, of a flexible display device, according to a first embodiment of the present disclosure.
Figure 7B:
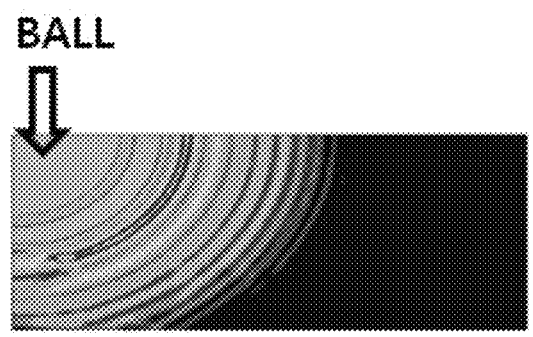
Figure 7C:
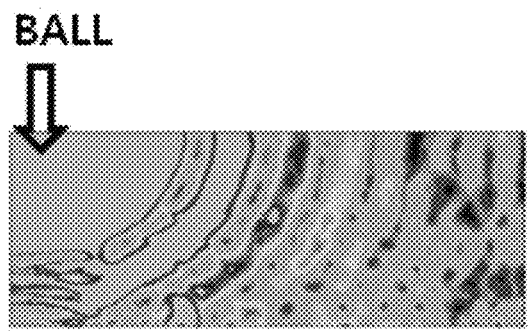
FIGS. 7C and 7D are simulation results showing an impact resistance of an active area and a non-active area, respectively, of a flexible display device, according to a second embodiment of the present disclosure.
Figure 7D:
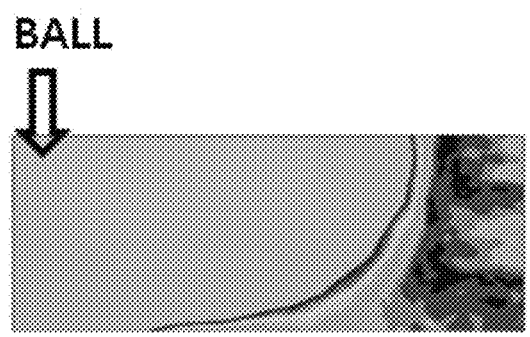

FIGS. 7A and 7B are simulation results showing an impact resistance of an active area and a non-active area, respectively, of a flexible display device according to a first embodiment of the present disclosure, and FIGS. 7C and 7D are simulation results showing an impact resistance of an active area and a non-active area, respectively, of a flexible display device according to a second embodiment of the present disclosure.

Figure 8:
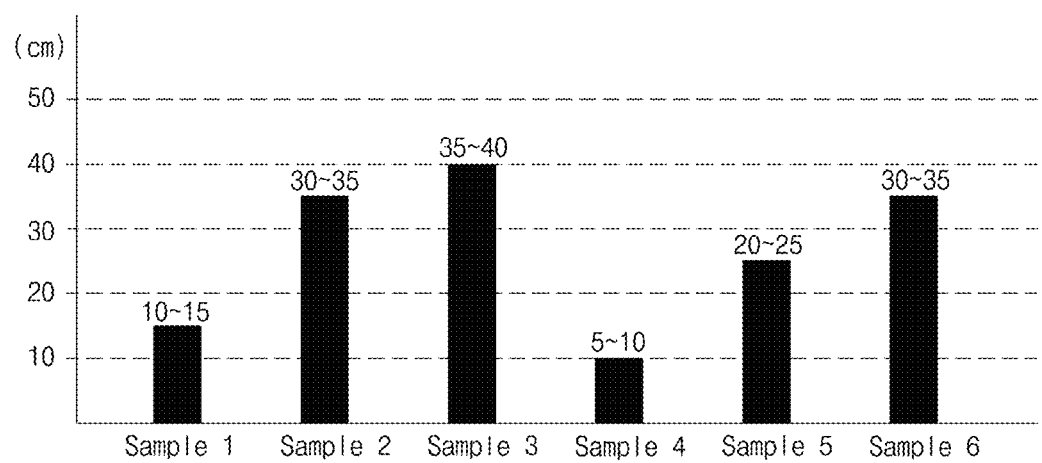
FIG. 8 is a graph showing a result of a ball drop test in a non-active area of a flexible display device, according to a second embodiment of the present disclosure.

FIG. 8 is a graph showing a result of a ball drop test in a non-active area of a flexible display device according to a second embodiment of the present disclosure.

A part of the second embodiment the same as a part of the first embodiment may be designated by the same reference number.

In FIG. 6A, a flexible display device 100 according to a second embodiment of the present disclosure includes a display panel 110 for displaying an image, a back cover 130 for supporting the display panel 110 and a cover window 140 for protecting the display panel 110, and a touch pattern 170 is disposed between the cover window 140 and the display panel 110.

When an image is displayed by an upper surface of the display panel 110, the touch pattern 170 and the cover window 140 are sequentially disposed over the display panel 110 and the back cover 130 is disposed under the display panel 110.

The display panel 110 includes an organic light emitting diode (OLED) display panel where a substrate 101 having a driving thin film transistor (TFT) DTr and a light emitting diode E is encapsulated by a protecting film 119.

The substrate 101 may include an active area A/A and a non-active area N/A, and the non-active area N/A may be disposed at a periphery of the active area A/A.

The active area A/A including a plurality of pixel regions P is an area where an image of the display panel 110 of the OLED panel is displayed, and the non-active area N/A except for the active area A/A is an area where various circuits and lines are disposed.

For example, the active area A/A may include an emission area EA where an image is substantially displayed by the light emitting diode E of each pixel region P and a non-emission area NEA surrounding the emission area EA and including a switching area STrA where the driving TFT DTr is disposed.

A semiconductor layer 103 is disposed in the switching area STrA of the non-emission area NEA of each pixel region P on the substrate 101. The semiconductor layer 103 includes an active region 103a constituting a channel at a central portion thereof and source and drain regions 103b and 103c at both sides of the active region 103a. The active region 103a may include intrinsic silicon and the source and drain regions 103b and 103c may include impurity doped silicon.

A gate insulating layer 105 is disposed on the semiconductor layer 103, and a gate electrode 107 is disposed on the gate insulating layer 105 over the active region 103a of the semiconductor layer 103. A gate line (not shown) is disposed along a direction on the gate insulating layer 105.

An interlayer insulating layer 109a is disposed on the gate electrode 107 and the gate line. The interlayer insulating layer 109a and the gate insulating layer 105 have first and second semiconductor contact holes 106 exposing the source and drain regions 103b and 103c at both sides of the active region 103a.

Source and drain electrodes 108a and 108b spaced apart from each other are disposed on the interlayer insulating layer 109a. The source and drain electrodes 108a and 108b are connected to the source and drain regions 103b and 103c, respectively, through the first and second semiconductor contact holes 106.

A protecting layer 109b is disposed on the source and drain electrodes 108a and 108b and on the interlayer insulating layer 109a exposed between the source and drain electrodes 108a and 108b.

The source and drain electrodes 108a and 108b, the semiconductor layer 103 including the source and drain regions 103b and 103c contacting the source and drain electrodes 108a and 108b, the gate insulating layer 105 on the semiconductor layer 103 and the gate electrode 107 constitute the driving TFT DTr.

In some embodiments, a data line (not shown) crossing the gate line to define the pixel region P is disposed on the interlayer insulating layer 109a. A switching TFT (not shown) having the same structure as the driving TFT DTr is connected to the driving TFT DTr.

The switching TFT and the driving TFT DTr may be classified into an amorphous silicon thin film transistor (a-Si TFT), a polycrystalline silicon thin film transistor (p-Si TFT), a single crystalline silicon thin film transistor (c-Si TFT) and an oxide thin film transistor (oxide TFT) according to a kind of the semiconductor layer 103. Although the semiconductor layer 103 has a top gate type in FIG. 6A, the semiconductor layer 103 may have a bottom gate type of intrinsic amorphous silicon and impurity-doped amorphous silicon in another embodiment.

The protecting layer 109b has a drain contact hole PH exposing the drain electrode 108b, and a first electrode 111 connected to the drain electrode 108b through the drain contact hole PH is disposed on the protecting layer 109b. The first electrode 111 may include a material having a relatively high work function to constitute an anode of a light emitting diode E.

The first electrode 111 may include a metallic material having a relatively high reflectance. The first electrode 111 may have a laminated structure (Ti/Al/Ti) of aluminum (Al) and titanium (Ti), a laminated structure (ITO/Al/ITO) of aluminum (Al) and indium tin oxide (ITO), an APC alloy of silver (Ag), palladium (Pd) and copper (Cu) and a laminated structure (ITO/APC/ITO) of APC alloy and indium tin oxide (ITO).

The first electrode 111 is disposed in each pixel region P, and a bank 118 is disposed between the first electrodes 111 of the adjacent pixel regions P. The first electrode 111 is divided into each pixel region P with the bank 118 as a boundary of the pixel region P.

A spacer 117 may be disposed on the bank 118 to protect a light emitting layer 113 of a light emitting diode E from an external pressure.

The light emitting layer 113 is disposed on the first electrode 111. The light emitting layer 113 may have a single layer of an emitting material. The light emitting layer 113 may have a multiple layer of a hole injecting layer (HIL), a hole transporting layer (HTL), an emitting material layer (EML), an electron transporting layer (ETL) and an electron injecting layer (EIL).

A second electrode 115 is disposed on a whole of the light emitting layer 113 on the substrate 101 to constitute a cathode.

The light emitting layer 113 may be commonly disposed on the pixel regions P as a common layer of a white emitting layer emitting a white light. Alternatively, the light emitting layer 113 may be divided in each pixel region P to include different materials. When the light emitting layer 113 is divided in each pixel region P, the light emitting layer 113 may have different thicknesses in the pixel regions P.

The second electrode 115 may include a material having a relatively low work function.

For example, the second electrode 115 may include a transparent conductive material such as indium tin oxide (ITO) and indium zinc oxide (IZO) or a semi-transmissive conductive material such as magnesium (Mg), silver (Ag) and an alloy of magnesium (Mg) and silver (Ag).

When the second electrode 115 is formed of a semi-transmissive conductive material, a light extraction efficiency may be improved by a micro cavity.

A capping layer may be disposed on the second electrode 115.

When a voltage is applied to the first and second electrodes 111 and 115 of the light emitting diode E according to a selected signal, a hole injected from the first electrode 111 and an electron injected from the second electrode 115 are transmitted to the light emitting layer 113 to constitute an exciton. When the exciton transitions from an excited state to a ground state, a light may be emitted from the light emitting layer 113 as a visible ray.

The light of the light emitting layer 113 may pass through the transparent second electrode 115 to be emitted toward an exterior such that an image is displayed.

After a protecting film 119 of a thin film type is disposed on the driving TFT DTr and the light emitting diode E, the display panel 110 is encapsulated by attaching the protecting film 119 and the substrate 101.

To prevent penetration of an external oxygen and an external moisture into an interior of the display panel 110, the protecting film 119 may include at least two inorganic protecting films 119a and 119c. An organic protecting film 119b for supplementing impact resistance of the at least two inorganic protecting films 119a and 119c may be interposed between the at least two inorganic protecting films 119a and 119c.

As a result, penetration of the moisture and the oxygen from the exterior to the interior of the display panel 110 may be prevented.

A dam 160 is disposed outside the organic protecting layer 109b such that the dam 160 completely surrounds the active area A/A. The dam 160 may restrict the organic protecting layer 109b of the protecting layer 109 for protecting the elements such as the driving TFT DTr and the light emitting diode E of the flexible display device 100 from particles such as an external moisture and an external oxygen therein.

The dam 160 may be formed by laminating the organic protecting layer 109b, the bank 118 and/or the spacer 117.

The touch pattern 170 is disposed on the protecting film 119.

In FIGS. 6A and 6B, the touch pattern 170 includes a plurality of touch sensing lines Tx and a plurality of touch driving lines Rx in the active area A/A. The plurality of touch sensing lines Tx are disposed parallel to an X axis direction, and the plurality of touch driving lines Rx are disposed parallel to a Y axis direction. The plurality of touch sensing lines Tx do not contact and cross the plurality of touch driving lines Rx.

The plurality of touch sensing lines Tx and the plurality of touch driving lines Rx are disposed on the protecting film 119. A touch buffer layer 171 is disposed on the protecting film 119, and the plurality of touch sensing lines Tx and the plurality of touch driving lines Rx are disposed over the touch buffer layer 171. A touch insulating layer 173 is disposed between the plurality of touch sensing lines Tx and the plurality of touch driving lines Rx.

The plurality of touch driving lines Rx includes a plurality of first touch electrodes 175a and a plurality of first bridges 175b electrically connecting the plurality of first touch electrodes 175a.

The plurality of first touch electrodes 175a are spaced apart from each other along the Y axis direction on the touch insulating layer 173. The first touch electrode 175a is electrically connected to the adjacent first touch electrode 175a through the first bridge 175b.

The first bridge 175b is disposed on the touch buffer layer 171 and is exposed through a touch contact hole 174 in the touch insulating layer 173. The first touch electrode 175a is electrically connected to the first bridge 175b through the touch contact hole 174.

The plurality of touch sensing lines Tx include a plurality of second touch electrodes 176a and a plurality of second bridges 176b electrically connecting the plurality of second touch electrodes 176a.

The plurality of second touch electrodes 176a are spaced apart from each other along the X axis direction on the touch insulating layer 173. The second touch electrode 176a is electrically connected to the adjacent second touch electrode 176a through the second bridge 176b.

The second bridge 176b is disposed on the touch insulating layer 173. Since the second touch electrode 176a and the second bridge 176b are disposed on the same touch insulating layer 173, the second touch electrode 176a and the second bridge 176b are electrically connected to each other without a contact hole.

The first and second bridges 175b and 176b may be disposed to overlap the bank 118 to prevent reduction in an aperture ratio due to the first and second bridges 175b and 176b.

Since the plurality of touch sensing lines Tx cross the plurality of touch driving lines Rx with the touch insulating layer 173 interposed therebetween, a mutual capacitance Cm is constituted at crossing of the touch sensing line Tx and the touch driving line Rx. As a result, the mutual capacitance Cm is charged by a touch driving pulse supplied to the touch driving line Rx and is discharged to the touch sensing line Tx to function as a touch sensor.

A touch protecting layer 179 is disposed on the touch sensing line Tx and the touch driving line Rx to prevent a corrosion of the touch sensing line Tx and the touch driving line Rx by an external moisture.

The touch sensing line Tx and the touch driving line Rx are connected to a touch pad 178 through first and second routing lines 177a and 177b in the non-active area N/A outside the active area A/A. Since the touch pad 178 is connected to a touch driving unit (not shown), the touch sensing line Tx and the touch driving line Rx are connected to the touch driving unit.

A polarizing plate 150 for preventing reduction of a contrast ratio due to an external light is disposed on the touch pattern 170. Since the polarizing plate 150 blocking the external light is disposed on a front surface of the OLED display panel in a driving mode where a light from the light emitting layer 113 is emitted, the contrast ratio increases.

The cover window 140 for protecting the display panel 110 is disposed on the polarizing plate 150.

The cover window 140 protects the display panel 110 from an external impact and transmits the light emitted from the display panel 110 such that an image displayed by the display panel 110 is shown to the exterior.

The cover window 140 includes a material having a relatively high impact resistance and a relatively high transmittance. For example, the cover window 140 may include one of polymethylmethacrylate (PMMA), polycarbonate (PC), cycloolefin polymer (COP), polyethylene terephthalate (PET), polyimide (PI) and polyaramid (PA).

The back cover 130 is disposed on a rear surface of the display panel 110 having the touch pattern 170, the polarizing plate 150 and the cover window 140, i.e., an outer surface of the substrate 101 such that the display panel 110 is supported by the back cover 130.

The back cover 130 has a plate shape. Although not shown, a hemming portion may be further formed along a boundary of the back cover 130 to increase a rigidity of the back cover 130.

The back cover 130 may include one of copper (Cu), silver (Ag), aluminum (Al), iron (Fe), nickel (Ni), tungsten (W) and an alloy including at least one of copper (Cu), silver (Ag), aluminum (Al), iron (Fe), nickel (Ni) and tungsten (W). Alternatively, the back cover 130 may be plated with at least one of nickel (Ni), silver (Ag), gold (Au) and an alloy including at least one of nickel (Ni), silver (Ag) and gold (Au).

When the back cover 130 is formed of aluminum (Al) having a relatively high heat conductivity, the back cover 130 may include aluminum (Al) of a purity of about 99.5%. In addition, an oxide film of a black color may be formed on a surface of the back cover through an anodizing treatment. Since the back cover 130 through an anodizing treatment has a black color, a heat absorptivity increases and a heat conductivity of the back cover 130 is improved.

As a result, the back cover 130 may effectively radiate a heat of a relatively high temperature generated from the display panel 110 to an exterior.

The back cover 130 and the display panel 110 are attached and fixed to each other through an optical adhesive layer 200. In the flexible display device 100 according to a second embodiment of the present disclosure, the optical adhesive layer 200 may include a soft layer 220 and first and second hard layers 210a and 210b.

Due to the optical adhesive layer 200, the flexible display device 100 may obtain an extreme folding toward an inside and an outside and an impact resistance of the flexible display device 100 may be improved. Since deterioration of the driving TFT DTr and the light emitting diode E is prevented even when an external impact is applied, reduction in reliability of the flexible display device 100 is prevented.

The optical adhesive layer 200 may include an optically cleared adhesive (OCA). The optical adhesive layer 200 may have a thickness of about 100 μm to about 300 μm. When the optical adhesive layer 200 has a thickness smaller than about 100 μm, it is difficult to modularize the display panel 110 and the back cover 130 due to a weak adhesive force. When the optical adhesive layer 200 has a thickness greater than about 300 μm, it is difficult to fold the flexible display device 100.

The optical adhesive layer 200 may include the first and second hard layers 210a and 210b each having a first modulus and the soft layer 220 having a second modulus smaller than the first modulus. The soft layer 220 may be disposed between the first and second hard layers 210a and 210b.

The first and second hard layers 210a and 210b having the first modulus may disperse the impact applied to the flexible display device 100. The first modulus may be equal to or greater than about 50 mPa.

The soft layer 220 having the second modulus may buffer the dispersed impact by the first and second hard layers 210a and 210b. The second modulus may be equal to or smaller than about 10 mPa.

In the flexible display device 100 according to a second embodiment of the present disclosure, since the optical adhesive layer 200 having a mixed structure of a layer having a relatively low modulus and a layer having a relatively high modulus is used for attaching the display panel 110 and the back cover 130, the impact applied from the exterior to the flexible display device 100 may be mitigated while passing through the layers having low and high moduli of the optical adhesive layer 200.

Specifically, the first and second hard layers 210a and 210b disperse the impact applied from the exterior, and the soft layer 220 buffering the impact by absorption is disposed between the first and second hard layers 210a and 210b. As a result, transmission of the impact to the display panel 110 may be effectively reduced. Accordingly, the impact resistance of the flexible display device 100 is improved.

In the optical adhesive layer 200 according to a second embodiment of the present disclosure, each of the first and second hard layers 210a and 210b may have a plurality of lenticular lenses 215 having a convex portion and a concave portion. Each of the plurality of lenticular lenses 215 has a half cylindrical shape protruding from the first and second hard layers 210a and 210b. Axes of the plurality of lenticular lenses 215 of the first and second hard layers 210a and 210b may cross each other.

For example, the plurality of lenticular lenses 215 may protrude from the first hard layer 210a to the second hard layer 210b to constitute a first lens layer 213a, and the plurality of lenticular lenses 215 may protrude from the second hard layer 210b to the first hard layer 210a to constitute a second lens layer 213b.

When the lenticular lens 215 of the first and second lens layers 213a and 213b of the first and second hard layers 210a and 210b returns from a deformed shape due to an external impact to an original shape, the lenticular lens 215 compensates a volume. As a result, an elastic force of the first and second hard layers 210a and 210b increases, and the first and second hard layers 210a and 210b may effectively disperse the impact applied to the flexible display device 100.

Although the axes of the lenticular lenses 215 of the first and second lens layers 213a and 213b are disposed along the same direction in FIG. 6A for illustration, the axes of the lenticular lenses 215 of the first and second lens layers 213a and 213b are disposed to cross each other.

For example, the axis of the lenticular lenses 215 of the first lens layer 213a may be disposed along an X axis direction and the axis of the lenticular lenses 215 of the second lens layer 213b may be disposed along a Y axis direction. As a result, the axes of the lenticular lenses 215 of the first and second lens layers 213a and 213b may be disposed perpendicular to each other.

Since the first and second hard layers 210a and 210b disperse the impact applied from the exterior along the X and Y axis directions, the first and second hard layers 210a and 210b may effectively disperse the impact applied to the flexible display device 100.

Accordingly, the impact resistance of the flexible display device 100 is further improved.

In the flexible display device 100 according to a second embodiment of the present disclosure, the optical adhesive layer 200 includes a first region B corresponding to the active area A/A on the substrate 101 and a second region C corresponding to the non-active area N/A on the substrate 101 at periphery of the active area A/A.

When the flexible display device 100 includes the touch pattern 170, the touch pad 178 and the first and second routing lines 177a and 177b are disposed in the non-active area A/A. As a result, the non-active area N/A having the touch pattern 170, the touch pad 178 and the first and second routing lines 177a and 177b may have a vulnerable structure as compared with the active area A/A.

The optical adhesive layer 200 may be divided into a portion of the first region B corresponding to the active area A/A and a portion of the second region C surrounding the first region B and corresponding to the non-active area N/A. A second width w2 of the lenticular lens 215 of the first and second lens layers 213a and 213b in the second region C may be smaller than a first width w1 of the lenticular lens 215 of the first and second lens layers 213a and 213b in the first region B.

As a width of the lenticular lens 215 of the first and second lens layers 213a and 213b in the first and second hard layers 210a and 210b of the optical adhesive layer 200 decreases, an impact resistance of the optical adhesive layer 200 increases.

Since the second width w2 of the lenticular lens 215 in the second region C corresponding to the non-active area N/A is smaller than the first width w1 of the lenticular lens 215 in the first region B corresponding to the active area A/A, the impact resistance in the non-active area N/A of the flexible display device 100 is further improved.

For example, the lenticular lens 215 in the first region B may have the first width w1 of about 100 μm, and the lenticular lens 215 in the second region C may have the second width w2 of about 50 μm equal to or smaller than a half of the first width w1.

In the flexible display device 100 according to a second embodiment of the present disclosure, since the impact resistance in the non-active area N/A is further improved, deterioration of the touch pad 178 and the first and second routing lines 177a and 177b of the touch pattern 170 in the non-active area N/A due to an external impact is prevented.

In addition, since the impact resistance in the non-active area N/A is improved, the whole impact resistance of the flexible display device 100 is further improved.

The effects due to the structure of the first and second lens layers 213a and 213b in the active area A/A and the non-active area N/A will be illustrated hereinafter with reference to FIGS. 7A to 7D.

When a ball is dropped on a point in the active area A/A and the non-active area N/A of the flexible display device 100, a transmission shape of an impact of the ball along a horizontal direction at a front surface of the flexible display device 100 is simulated.

In FIGS. 7A and 7B, the optical adhesive layer 200 of the flexible display device 100 according to a first embodiment of the present disclosure includes the first and second hard layers 210a and 210b and the soft layer 220 between the first and second hard layers 210a an 210b, and the first and second hard layers 210a and 210b include the first and second lens layers 213a and 213b where the axes of the lenticular lenses 215 cross each other.

In FIGS. 7C and 7D, the flexible display device 100 according to a second embodiment of the present disclosure includes the optical adhesive layer 200 including the first and second hard layers 210a and 210b and the soft layer 220 between the first and second hard layers 210a and 210b, and the first and second hard layers 210a and 210b include the first and second lens layers 213a and 213b where the axes of the lenticular lenses 215 cross each other. The first and second lens layers 213a and 213b includes the lenticular lens 215 of the first width w1 in the active area A/A and the lenticular lens 215 of the second width w2 smaller than the first width w1 in the non-active area N/A.

While the impact applied by the ball in the active area A/A is uniformly transmitted along the horizontal direction toward the whole surface in FIG. 7A, the impact applied by the ball in the non-active area N/A is not transmitted along the horizontal direction and is concentrated on a drop point in FIG. 7B.

The impact applied by the ball in the active area A/A is uniformly transmitted along the horizontal direction toward the whole surface in FIG. 7C, and the impact applied by the ball in the non-active area N/A is uniformly transmitted along the horizontal direction toward the whole surface in FIG. 7D.

In the optical adhesive layer 200 according to a second embodiment of the present disclosure, the plurality of lenticular lenses 215 each having a half cylindrical shape protrude from the first and second hard layers 210a and 210b, and the axes of the plurality of lenticular lenses 215 of the first and second hard layers 210a and 210b cross each other. In addition, the lenticular lens 215 in the active area A/A has the first width w1, and the lenticular lens 215 in the non-active area N/A has the second width w2 smaller than the first width w1. As a result, the impact applied from the exterior to the flexible display device 100 is further effectively dispersed in both of the active area A/A and the non-active area N/A.

Since the impact is further effectively dispersed due to the first and second hard layers 210a and 210b, the impact resistance of the optical adhesive layer 200 is further improved. As a result, the impact resistance of the flexible display device 100 is further improved.

In FIG. 8, the vertical axis represents a height where the ball is dropped. The Sample 1 of the horizontal axis represents an active area A/A of a flexible display device including an optical adhesive layer without first and second lens layers according to a comparison example, the Sample 2 of the horizontal axis represents an active area A/A of a flexible display device 100 including an optical adhesive layer 200 with first and second lens layers 213a and 213b according to a first embodiment of the present disclosure, and the Sample 3 of the horizontal axis represents an active area A/A of a flexible display device 100 including an optical adhesive layer 200 with first and second lens layers 213a and 213b according to a second embodiment of the present disclosure.

The Sample 4 of the horizontal axis represents a non-active area N/A of a flexible display device including an optical adhesive layer without first and second lens layers according to a comparison example, the Sample 5 of the horizontal axis represents a non-active area N/A of a flexible display device 100 including an optical adhesive layer 200 with first and second lens layers 213a and 213b according to a first embodiment of the present disclosure, and the Sample 6 of the horizontal axis represents a non-active area N/A of a flexible display device 100 including an optical adhesive layer 200 with first and second lens layers 213a and 213b according to a second embodiment of the present disclosure.

The bar of FIG. 8 corresponds to the height of the ball where a breakdown of the flexible display device begins.

In FIG. 8, the breakdown of the display panel of the Sample 1 occurs when the ball is dropped at the height of about 10 cm to about 15 cm. The breakdown of the display panel 110 of the Sample 2 occurs when the ball is dropped at the height of about 30 cm to about 35 cm, and the breakdown of the display panel 110 of the Sample 3 occurs when the ball is dropped at the height of about 35 cm to about 40 cm.

From comparison of the Sample 1 and the Sample 2, the impact resistance of the flexible display device 100 is improved by forming the optical adhesive layer 200 with the first and second hard layers 210a and 210b and the soft layer 220 between the first and second hard layers 210a and 210b and forming the first and second lens layers 213a and 213b in the first and second hard layers 210a and 210b.

From comparison of the Sample 2 and the Sample 3, the impact resistance of the flexible display device 100 is further improved by forming the lenticular lens 215 of the first width w1 in the first region B corresponding to the active area A/A and forming the lenticular lens 215 of the second width w2 smaller than the first width w1 in the second region C corresponding to the non-active area N/A.

In addition, the breakdown of the display panel of the Sample 4 occurs when the ball is dropped at the height of about 5 cm to about 10 cm. The breakdown of the display panel 110 of the Sample 5 occurs when the ball is dropped at the height of about 20 cm to about 25 cm, and the breakdown of the display panel 110 of the Sample 6 occurs when the ball is dropped at the height of about 30 cm to about 35 cm.

In the flexible display device 100, the non-active area N/A may have a vulnerable structure as compared with the active area A/A. In the flexible display device 100 according to a second embodiment of the present disclosure, since the optical adhesive layer 200 is divided into the first and second regions B and C and the second width w2 of the lenticular lens 215 of the second region C corresponding to the non-active area N/A is smaller than the first width w1 of the lenticular lens 215 of the first region B corresponding to the active area A/A, the impact resistance of the flexible display device 100 in the non-active area N/A is further improved.

In the flexible display device 100 according to a second embodiment of the present disclosure, since the optical adhesive layer 200 for attaching and fixing the display panel 110 and the back cover 130 has the mixed structure of the soft layer 220 having a relatively low modulus and the first and second hard layers 210a and 210b having a relatively high modulus, the impact resistance increases.

Further, since the first and second hard layers 210a and 210b include the first and second lens layers 213a and 213b of the lenticular lens 215 and the axes of the lenticular lenses of the first and second lens layers 213a and 213b cross each other, the impact from the exterior is further effectively dispersed by the first and second hard layers 210a and 210b. As a result, the impact resistance of the flexible display device 100 further increases.

Specifically, since the second width w2 of the lenticular lens 215 in the second region C corresponding to the non-active area N/A is smaller than the first width w1 of the lenticular lens 215 in the first region B corresponding to the active region A/A, the impact resistance of the flexible display device 100 is further increases.

Although the optical adhesive layer 200 attaches and fixes the display panel 110 and the back cover 130 in the first and second embodiments, the optical adhesive layer 200 may be disposed between the display panel 110 and the polarizing plate 150 or between the polarizing plate 150 and the cover window 140 in another embodiment.

Consequently, in the flexible display device according to first and second embodiments of the present disclosure, the optical adhesive layer for attaching and fixing the display panel and the back cover has the mixed structure of the soft layer having a relatively low modulus and the first and second hard layers having a relatively high modulus, and the axes of the lenticular lenses of the first and second lens layers of the first and second hard layers cross each other. As a result, the impact applied from the exterior is further effectively dispersed, and the impact resistance of the flexible display device is further improved.

Therefore, the reliability of the flexible display device is further improved.

The present disclosure also relates to and is not limited to the following aspects.

In the present disclosure, a flexible display device includes: a display panel; a back cover on a rear surface of the display panel; and an optical adhesive layer between the display panel and the back cover, the optical adhesive layer including first and second hard layers and a soft layer between the first and second hard layers, at least one of the first and second hard layers having a first modulus and the soft layer having a second modulus smaller than the first modulus.

In the present disclosure, the first hard layer includes a first lens layer protruding toward the second hard layer, and the first lens layer includes a plurality of first lenses having a convex portion and a concave portion and disposed along a first direction.

In the present disclosure, the second hard layer includes a second lens layer protruding toward the first hard layer, and the second lens layer includes a plurality of second lenses having a convex portion and a concave portion and disposed along a second direction crossing the first direction.

In the present disclosure, the optical adhesive layer includes a first region corresponding to an active area of the display panel and a second region corresponding to a non-active area surrounding the active area, and at least one of the plurality of first lenses and the plurality of second lenses in the first region has a first width, and at least one of the plurality of first lenses and the plurality of second lenses in the second region has a second width smaller than the first width.

In the present disclosure, the second width is equal to or smaller than a half of the first width.

In the present disclosure, the first and second widths are within a range of 50 μm to 150 μm.

In the present disclosure, at least one of the plurality of first lenses and the plurality of second lenses includes a lenticular lens having a cross-sectional shape of a half circle.

In the present disclosure, the first modulus is within a range of 50 mPa to 100 mPa, and the second modulus is within a range of 1 mPa to 10 mPa.

In the present disclosure, the flexible display device further includes: a touch pattern in the active area on a front surface of the display panel; and first and second routing lines in the non-active area on the front surface of the display panel, the first and second routing lines connected to the touch pattern.

In the present disclosure, the display panel includes: a substrate including the active area and the non-active area; a driving thin film transistor and a light emitting diode in the active area on the substrate; and a protecting film on the driving thin film transistor and the light emitting diode.

In the present disclosure, the display panel further includes a dam surrounding the active area.

In the present disclosure, the flexible display device further includes; a polarizing plate over a front surface of the display panel; and a cover window on the polarizing plate.

In the present disclosure, an oxide film of a black color is disposed on a surface of the back cover.

In the present disclosure, a flexible display device includes: a display panel; a polarizing plate over a front surface of the display panel; a cover window on the polarizing plate; and an optical adhesive layer between the display panel and the cover window, the optical adhesive layer including first and second hard layers and a soft layer between the first and second hard layers, at least one of the first and second hard layers having a first modulus and the soft layer having a second modulus less than the first modulus.

In the present disclosure, the optical adhesive layer is disposed between the display panel and the polarizing plate or between the polarizing plate and the cover window.

It will be apparent to those skilled in the art that various modifications and variation can be made without departing from the spirit or scope of the disclosure. Thus, it is intended that the present disclosure cover the modifications and variations of this disclosure provided they come within the scope of the claims and their equivalents.

What is claimed is:

1. A flexible display device, comprising:
   a display panel;
   a back cover on a rear surface of the display panel; and
   an optical adhesive layer between the display panel and the back cover, the optical adhesive layer including first and second hard layers and a soft layer between the first and second hard layers, at least one of the first and second hard layers having a first modulus and the soft layer having a second modulus less than the first modulus.

2. The flexible display device of claim 1, wherein the first hard layer includes a first lens layer protruding toward the second hard layer, and
   wherein the first lens layer includes a plurality of first lenses having a convex portion and a concave portion and disposed along a first direction.

3. The flexible display device of claim 2, wherein the second hard layer includes a second lens layer protruding toward the first hard layer, and
   wherein the second lens layer includes a plurality of second lenses having a convex portion and a concave portion and disposed along a second direction crossing the first direction.

4. The flexible display device of claim 3, wherein the optical adhesive layer includes a first region corresponding to an active area of the display panel and a second region corresponding to a non-active area surrounding the active area, and
   wherein at least one of the plurality of first lenses and the plurality of second lenses in the first region has a first width, and at least one of the plurality of first lenses and the plurality of second lenses in the second region has a second width less than the first width.

5. The flexible display device of claim 4, wherein the second width is equal to or less than half of the first width.

6. The flexible display device of claim 4, wherein the first and second widths are within a range of 50 μm to 150 μm.

7. The flexible display device of claim 4, further comprising:
   a touch pattern in the active area on a front surface of the display panel; and
   first and second routing lines in the non-active area on the front surface of the display panel, the first and second routing lines connected to the touch pattern.

8. The flexible display device of claim 4, wherein the display panel comprises:
   a substrate including the active area and the non-active area;
   a driving thin film transistor and a light emitting diode in the active area on the substrate; and
   a protecting film on the driving thin film transistor and the light emitting diode.

9. The flexible display device of claim 8, wherein the display panel further comprises a dam surrounding the active area.

10. The flexible display device of claim 3, wherein at least one of the plurality of first lenses and the plurality of second lenses includes a lenticular lens having a cross-sectional shape of a half circle.

11. The flexible display device of claim 1, wherein the first modulus is within a range of 50 mPa to 100 mPa, and the second modulus is within a range of 1 mPa to 10 mPa.

12. The flexible display device of claim 1, further comprising;
   a polarizing plate over a front surface of the display panel; and
   a cover window on the polarizing plate.

13. The flexible display device of claim 1, wherein an oxide film of a black color is disposed on a surface of the back cover.

14. A flexible display device, comprising:
   a display panel;
   a polarizing plate over a front surface of the display panel;
   a cover window on the polarizing plate; and
   an optical adhesive layer between the display panel and the cover window, the optical adhesive layer including first and second hard layers and a soft layer between the first and second hard layers, at least one of the first and second hard layers having a first modulus and the soft layer having a second modulus less than the first modulus.

15. The flexible display device of claim 14, wherein the optical adhesive layer is disposed between the display panel and the polarizing plate or between the polarizing plate and the cover window.

* * * * *